(12) United States Patent
Bhat et al.

(10) Patent No.: US 12,712,162 B2
(45) Date of Patent: Aug. 18, 2026

(54) BIASABLE ELECTROSTATIC CHUCK

(71) Applicant: Applied Materials, Inc., Santa Clara, CA (US)

(72) Inventors: Paneendra Prakash Bhat, Fremont, CA (US); Qiwei Liang, Fremont, CA (US); Douglas Buchberger, Livermore, CA (US); Dmitry Lubomirsky, Cupertino, CA (US); Naveen Kumar Nagaraja, Bangalore (IN); Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 18/403,982

(22) Filed: Jan. 4, 2024

(65) Prior Publication Data

US 2024/0234108 A1 Jul. 11, 2024

Related U.S. Application Data

(60) Provisional application No. 63/438,123, filed on Jan. 10, 2023.

(51) Int. Cl.
*H01L 21/683* (2006.01)
*G03F 7/00* (2006.01)
(Continued)

(52) U.S. Cl.
CPC .......... *H01J 37/32724* (2013.01); *G03F 7/38* (2013.01); *G03F 7/70708* (2013.01);
(Continued)

(58) Field of Classification Search
CPC ... H01J 37/32724; G03F 7/38; H01L 21/6833
See application file for complete search history.

(56) References Cited

U.S. PATENT DOCUMENTS

2009/0178764 A1 7/2009 Kanno et al.
2010/0039747 A1* 2/2010 Sansoni ............ H01L 21/67103 361/234

(Continued)

FOREIGN PATENT DOCUMENTS

JP 2008277847 A 11/2008
KR 20110049867 A 5/2011

(Continued)

OTHER PUBLICATIONS

Application No. PCT/US2024/010709 , International Search Report and Written Opinion, Mailed On Apr. 30, 2024, 10 pages.

(Continued)

*Primary Examiner* — Scott Bauer
(74) *Attorney, Agent, or Firm* — Kilpatrick Townsend & Stockton LLP

(57) ABSTRACT

Exemplary substrate support assemblies may include an electrostatic chuck body defining a substrate support surface that defines a substrate seat. The electrostatic chuck body may define a backside gas lumen that extends through a surface of the substrate seat. The assemblies may include a bias electrode coupled with the electrostatic chuck body. The bias electrode may include a plurality of conductive mesas that protrude upward across the substrate seat. The assemblies may include a support stem coupled with the electrostatic chuck body. The assemblies may include at least one chucking electrode embedded within the electrostatic chuck body. The assemblies may include at least one heater embedded within the electrostatic chuck body.

20 Claims, 9 Drawing Sheets

(51) Int. Cl.
*G03F 7/38* (2006.01)
*H01J 37/32* (2006.01)
*H10P 72/72* (2026.01)

(52) U.S. Cl.
CPC ...... *H01J 37/32642* (2013.01); *H10P 72/722* (2026.01); *H01J 2237/002* (2013.01); *H01J 2237/2007* (2013.01)

(56) References Cited

U.S. PATENT DOCUMENTS

| | | | | |
|---|---|---|---|---|
| 2015/0138687 | A1 | 5/2015 | Boyd, Jr. et al. | |
| 2019/0013222 | A1* | 1/2019 | Kim | H01J 37/32724 |
| 2020/0251371 | A1* | 8/2020 | Kuno | H01L 21/6831 |
| 2020/0402777 | A1 | 12/2020 | Sasaki et al. | |
| 2021/0035844 | A1 | 2/2021 | Cho et al. | |
| 2021/0130949 | A1 | 5/2021 | Min et al. | |
| 2022/0102179 | A1 | 3/2022 | Ye et al. | |
| 2022/0122875 | A1* | 4/2022 | Li | H01L 21/6833 |
| 2024/0258078 | A1* | 8/2024 | Sato | H01J 37/32568 |

FOREIGN PATENT DOCUMENTS

| | | | |
|---|---|---|---|
| KR | 20160139459 | A | 12/2016 |
| KR | 20180097789 | A | 8/2018 |
| TW | 202245113 | A | 11/2022 |

OTHER PUBLICATIONS

International Application No. PCT/US2024/010709, International Preliminary Report on Patentability mailed on Jul. 24, 2025, 7 pages.

Taiwanese Application No. 113100883, Notice of Decision to Grant mailed on Aug. 30, 2024, 6 pages (3 pages of English Translation and 3 pages of original document).

Taiwanese Application No. 113146313, Notice of Decision to Grant mailed on Jun. 6, 2025, 6 pages (3 pages of English Translation and 3 pages of original document).

Korean Application No. 10-2025-7026141, Office Action mailed on Dec. 8, 2025, 13 pages (7 pages of English Translation and 6 pages of Original Document).

* cited by examiner

BIASABLE ELECTROSTATIC CHUCK

CROSS-REFERENCE TO RELATED APPLICATION

This application claims benefit of U.S. Provisional Patent Application No. 63/438,123, entitled "Biasable Electrostatic Chuck," filed on Jan. 10, 2023, the contents of which are hereby incorporated by reference in their entirety.

TECHNICAL FIELD

The present technology relates to semiconductor processes and equipment. More specifically, the present technology relates to substrate processing systems and components.

BACKGROUND

Post exposure bake (PEB) is a critical step in the lithography process for semiconductors. With chemically amplified photoresist (CAR), the higher temperature during PEB completes the photoreaction, which was initiated during exposure. Chemical amplification takes place when the reaction products formed during the exposure in the resist film works catalytically during PEB. Adding electric field to PEB (EFE-PEB) results in anisotropic diffusion of the reacting acid in CAR, greatly increasing the sensitivity and process window available during lithography exposure.

Certain processes utilize temperature and weak plasma (to apply an electric field) to perform EFE-PEB. It is known that many critical parameters like line roughness of developed resist, LCDU, etc. are strong functions of temperature and electric current non-uniformities, as well as the time delay between the electric field application and wafer entry to chamber.

Oftentimes, the substrates are vacuum chucked to a substrate support. However, the use of a vacuum chuck causes large delays between the introduction of the wafer and the application of the electric field across the wafer. This results in the wafer spending long periods of time within a higher temperature environment and can cause quality issues on wafer as well as reduce throughput.

Thus, there is a need for improved systems and methods that can be used to efficiently heat and chuck substrates for post exposure bake operations. These and other needs are addressed by the present technology.

SUMMARY

Exemplary substrate support assemblies may include an electrostatic chuck body defining a substrate support surface that defines a substrate seat. The electrostatic chuck body may define a backside gas lumen that extends through a surface of the substrate seat. The assemblies may include a bias electrode coupled with the electrostatic chuck body. The bias electrode may include a plurality of conductive mesas that protrude upward across the substrate seat. The assemblies may include a support stem coupled with the electrostatic chuck body. The assemblies may include at least one chucking electrode embedded within the electrostatic chuck body. The assemblies may include at least one heater embedded within the electrostatic chuck body.

In some embodiments, the bias electrode may include a conductive mesh disposed atop the surface of the substrate seat. The assemblies may include an edge ring coupled with a peripheral edge of the electrostatic chuck body. An edge of the bias electrode may include a conductive element that contacts the edge ring. The assemblies may include a cooling plate disposed beneath the electrostatic chuck body. The cooling plate may be coupled with a bottom surface of the edge ring. The assemblies may include an electrical connection between the edge ring and the cooling plate. The plurality of conductive mesas may include a wear resistant, electrically conductive coating. The electrostatic chuck body may operate as a Johnsen-Rahbek chuck. The electrostatic chuck body may define a plurality of additional mesas that protrude from the surface of the substrate seat. The assemblies may include a power source that is electrically coupled with the bias electrode. The at least one heater may include one or more upper heaters and one or more lower heaters. The one or more upper heaters may include a plurality of pixel heaters. The plurality of pixel heaters may include multiple heaters at different angular positions relative to a center of the substrate seat and multiple heaters at different radial positions relative to the center of the substrate seat. The one or more lower heaters may include a plurality of zonal heaters. The plurality of zonal heaters may include one or more heaters selected from a group consisting of a plurality of wedge-shaped heaters, a plurality of arc-shaped heaters, a central circular heater, and one or more annular heaters that are concentric with the central circular heater. The bias electrode may be embedded within the electrostatic chuck body and the plurality of conductive mesas may protrude through the surface of the substrate seat.

Some embodiments of the present technology may encompass substrate support assemblies that include an electrostatic chuck body defining a substrate support surface that defines a substrate seat. The electrostatic chuck body may define a backside gas lumen that extends through a surface of the substrate seat. The assemblies may include a bias electrode having a conductive mesh disposed atop the surface of the substrate seat. The bias electrode may include a plurality of conductive mesas that protrude upward from the conductive mesh. The assemblies may include a support stem coupled with the electrostatic chuck body. The assemblies may include at least one chucking electrode embedded within the electrostatic chuck body. The assemblies may include at least one heater embedded within the electrostatic chuck body.

In some embodiments, the assemblies may include an edge ring coupled with a peripheral edge of the electrostatic chuck body. An edge of the bias electrode may include a conductive element that contacts the edge ring. The assemblies may include a cooling plate disposed beneath the electrostatic chuck body. The cooling plate may be coupled with a bottom surface of the edge ring. The assemblies may include an electrical connection between the edge ring and the cooling plate. The plurality of conductive mesas on the bias electrode may include a hard, low coefficient of friction, wear resistant, electrically conductive coating. The electrostatic chuck body may define a plurality of additional mesas either conductive or otherwise that protrude from the surface of the substrate seat, and not on the bias electrode. The electrostatic chuck body may operate as a coulombic chuck. The conductive mesh may include an inner ring, an outer ring, and a plurality of spokes that connect the inner ring and the outer ring. The conductive mesh further may include an intermediate ring disposed between the inner ring and the outer ring. The intermediate ring may be coupled with the plurality of spokes. At least 75% of a surface area of the surface of the substrate seat may be free of mesas.

Some embodiments of the present technology may encompass substrate support assemblies that include an electrostatic chuck body defining a substrate support surface that defines a substrate seat. The electrostatic chuck body may define a backside gas lumen that extends through a surface of the substrate seat. The assemblies may include a bias electrode coupled with the electrostatic chuck body. The bias electrode may include a plurality of conductive mesas that protrude upward across the substrate seat. The assemblies may include an edge ring coupled with a peripheral edge of the electrostatic chuck body. An edge of the bias electrode may include a conductive element that contacts the edge ring. The assemblies may include a cooling plate disposed beneath the electrostatic chuck body. The cooling plate may be coupled with a bottom surface of the edge ring. The assemblies may include an electrical connection between the edge ring and the cooling plate. The assemblies may include a support stem coupled with the electrostatic chuck body. The assemblies may include at least one chucking electrode embedded within the electrostatic chuck body. The assemblies may include at least one heater embedded within the electrostatic chuck body.

In some embodiments, the assemblies may include an additional plurality of mesas having a first diameter. The plurality of mesas may have a second diameter that is larger than the first diameter. The substrate support assemblies may include a greater number of the additional plurality of mesas than the plurality of conductive mesas. The additional plurality of mesas may include a same material as the plurality of conductive mesas.

Such technology may provide numerous benefits over conventional systems and techniques. For example, the substrate support assemblies may provide a bias electrode that enables a substrate supported thereon to be electrically biased to generate an electric field across the substrate. The electric field may enable electric field enhanced post exposure bake operations to be performed using an electrostatic chuck. Additionally, an inert gas may be flowed to a backside of the substrate, which may increase thermal uniformity and rate of temperature increase of the substrate and help increase throughput of substrate processing within the chamber. These and other embodiments, along with many of their advantages and features, are described in more detail in conjunction with the below description and attached FIGURES.

BRIEF DESCRIPTION OF THE DRAWINGS

A further understanding of the nature and advantages of the disclosed technology may be realized by reference to the remaining portions of the specification and the drawings.

Figure 1:
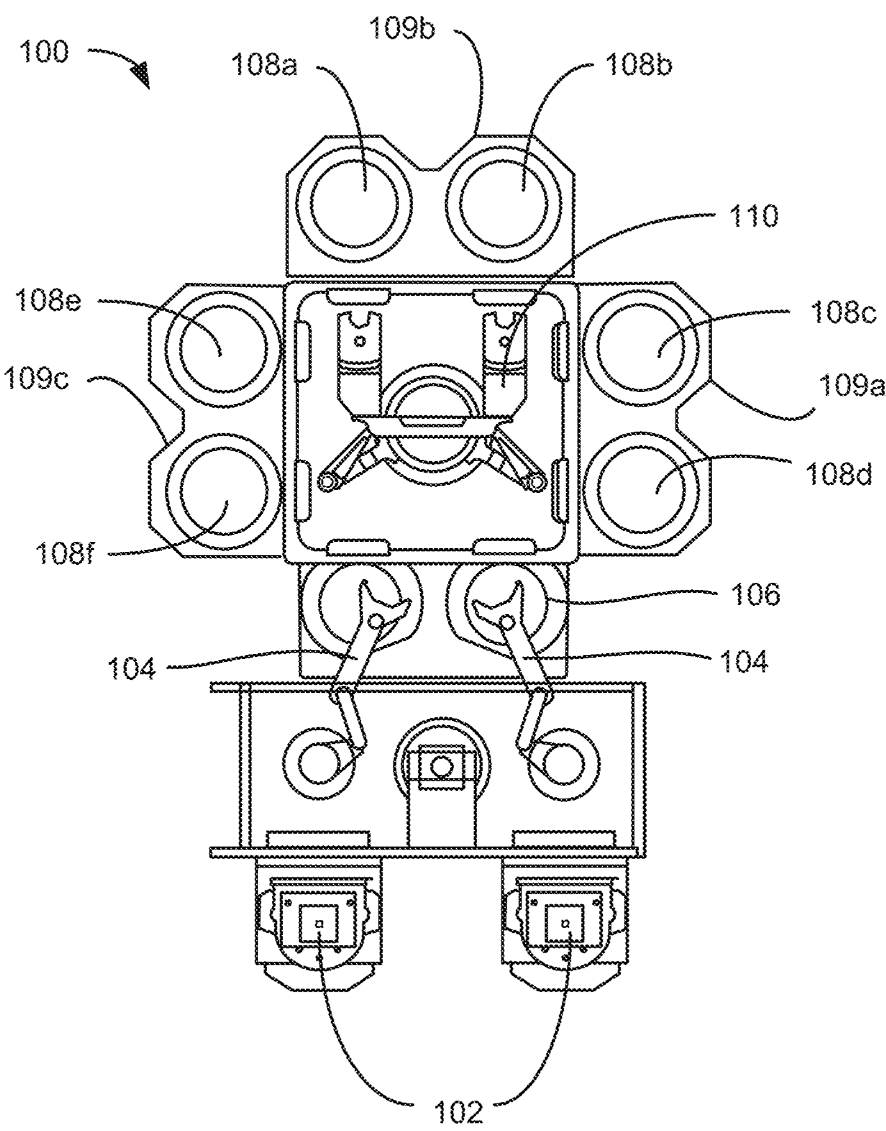
FIG. 1 shows a top plan view of an exemplary processing system according to some embodiments of the present technology.

Several of the FIGURES are included as schematics. It is to be understood that the FIGURES are for illustrative purposes, and are not to be considered of scale unless specifically stated to be of scale. Additionally, as schematics, the FIGURES are provided to aid comprehension and may not include all aspects or information compared to realistic representations, and may include exaggerated material for illustrative purposes.

In the appended FIGURES, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Post exposure bake (PEB) may involve the use of high temperatures to complete the photoreaction of chemically amplified photoresist (CAR) that was initiated during exposure. Chemical amplification takes place when the reaction products formed during the exposure in the resist film works catalytically during PEB. Adding electric field to PEB (EFE-PEB) results in anisotropic diffusion of the reacting acid in CAR, greatly increasing the sensitivity and process window available during lithography exposure. Conventionally, vacuum chucks have been used to clamp the substrate to the substrate support during such PEB operations. However, vacuum chucks may not be suitable for PEB operations that are supplemented with electric fields. For example, in order to heat the substrate to a desired temperature, a pressure within the chamber must be noticeably increased to press the substrate against the substrate support to facilitate sufficient heat transfer. However, the plasma may not be struck, and electric field may not be applied, until the pressure within the chamber is reduced to the initial levels. This results in the substrate spending long periods of time within a higher temperature environment and can cause quality issues on wafer as well as reduces throughput.

The present technology overcomes these challenges by incorporating bias electrodes into electrostatic chucks. The bias electrodes may supply a bias current to a substrate that is in contact with the bias electrode and may enable the chuck to be used in EFE-PEB operations. The use of the electrostatic chuck eliminates the need to change the chamber pressure to heat the substrate, which helps reduce the amount of time the substrate spends within the higher temperature environment. This may improve the quality of the process and may increase chamber throughput. To further enhance heat transfer from the substrate support to the substrate, an inert gas may be flowed to the backside of the substrate to better thermally couple the substrate with the substrate support. The insert gas may facilitate faster heat transfer and further improve the EFE-PEB operations quality and efficiency.

Although the remaining disclosure will routinely identify specific post exposure bake processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
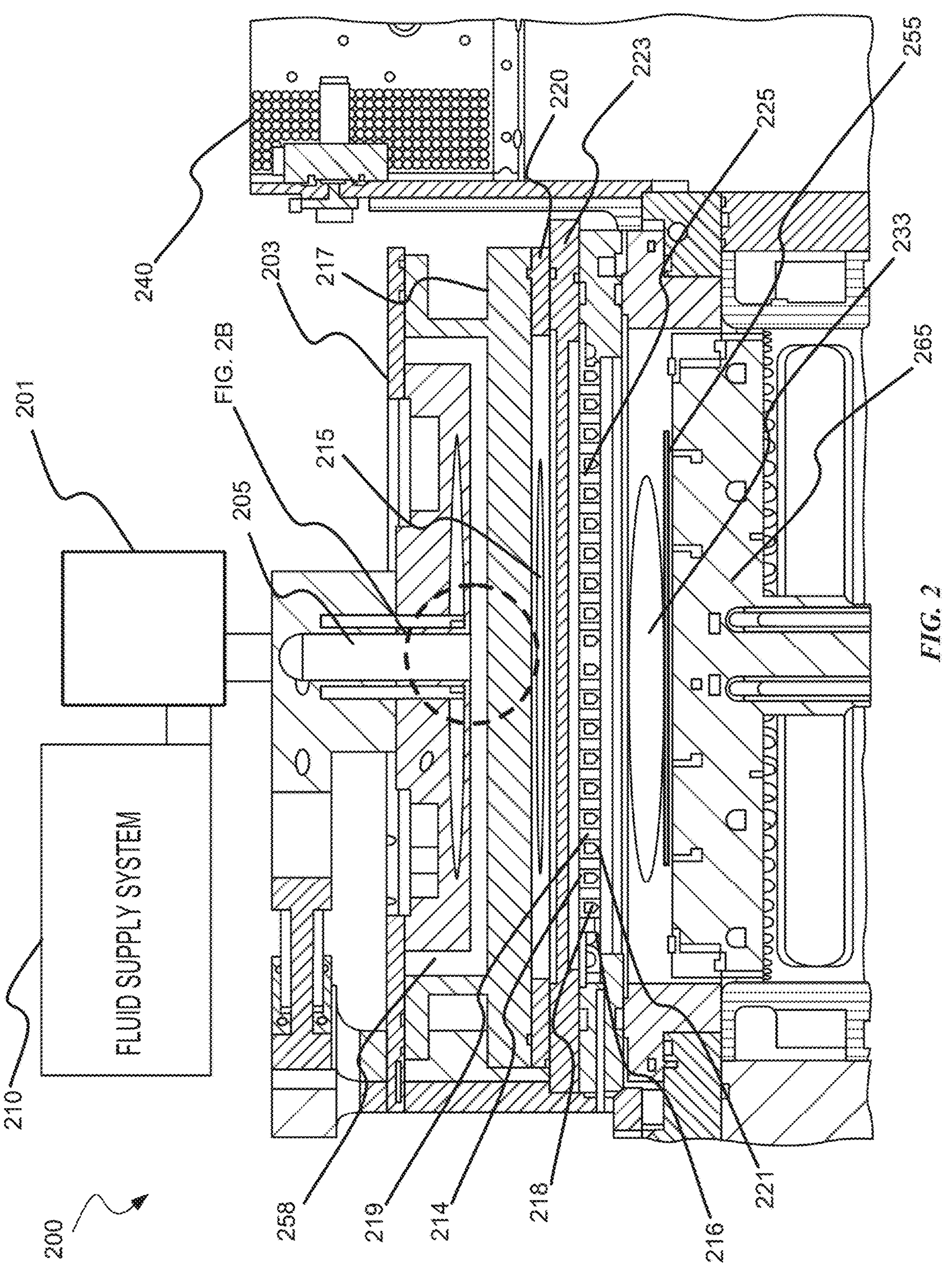
FIG. 2 shows a schematic cross-sectional view of an exemplary plasma system according to some embodiments of the present technology.

FIG. 2 shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 3:
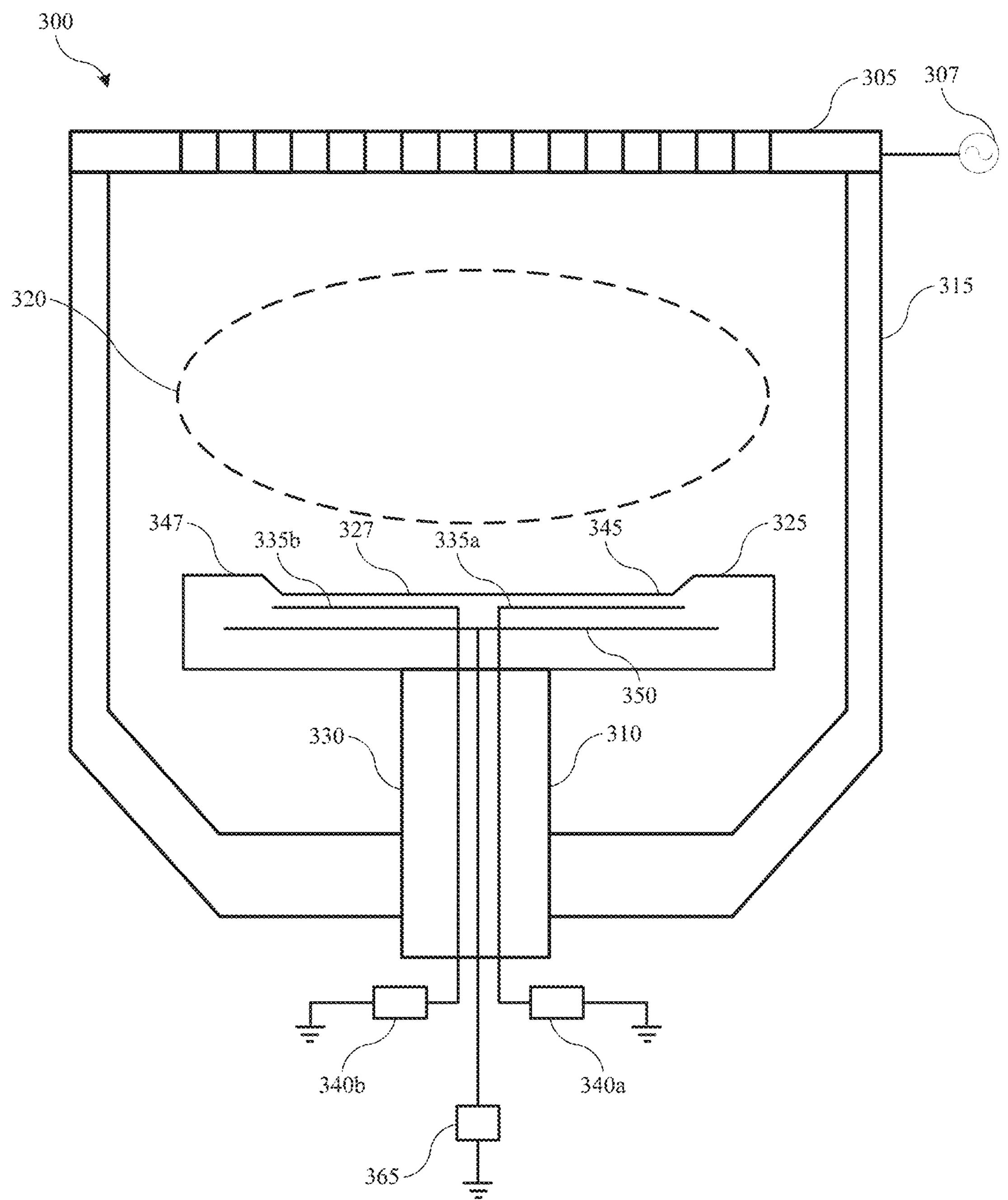
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include a first bipolar electrode **335*a*, which may be embedded within the chuck body proximate the substrate support surface. Electrode 335*a* may be electrically coupled with a DC power source 340*a*. Power source 340*a* may be configured to provide energy or voltage to the electrically conductive chuck electrode 335*a*. This may be operated to form a plasma of a precursor within the processing region 320 of the semiconductor processing chamber 300, although other plasma operations may similarly be sustained. For example, electrode 335*a* may also be a chucking mesh that operates as electrical ground for a capacitive plasma system including an RF source 307 electrically coupled with showerhead 305. For example, electrode 335***a* may operate as a ground path for RF power from the RF source 307, while also operating as an electric bias to the substrate to provide electrostatic clamping of the substrate to the substrate support surface. Power source 340*a* may include a filter, a power supply, and a number of other electrical components configured to provide a chucking voltage.

The electrostatic chuck body may also include a second bipolar electrode 335*b*, which may also be embedded within the chuck body proximate the substrate support surface. Electrode 335*b* may be electrically coupled with a DC power source 340*b*. Power source 340*b* may be configured to provide energy or voltage to the electrically conductive chuck electrode 335*b*. Additionally electrical components and details about bipolar chucks according to some embodiments will be described further below, and any of the designs may be implemented with processing chamber 300. For example, additional plasma related power supplies or components may be incorporated as will be explained further below.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340*a* and 340*b* may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° ° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° ° C., above or about 900° C., above or about 950° C., above or about 1000° ° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Figure 4:
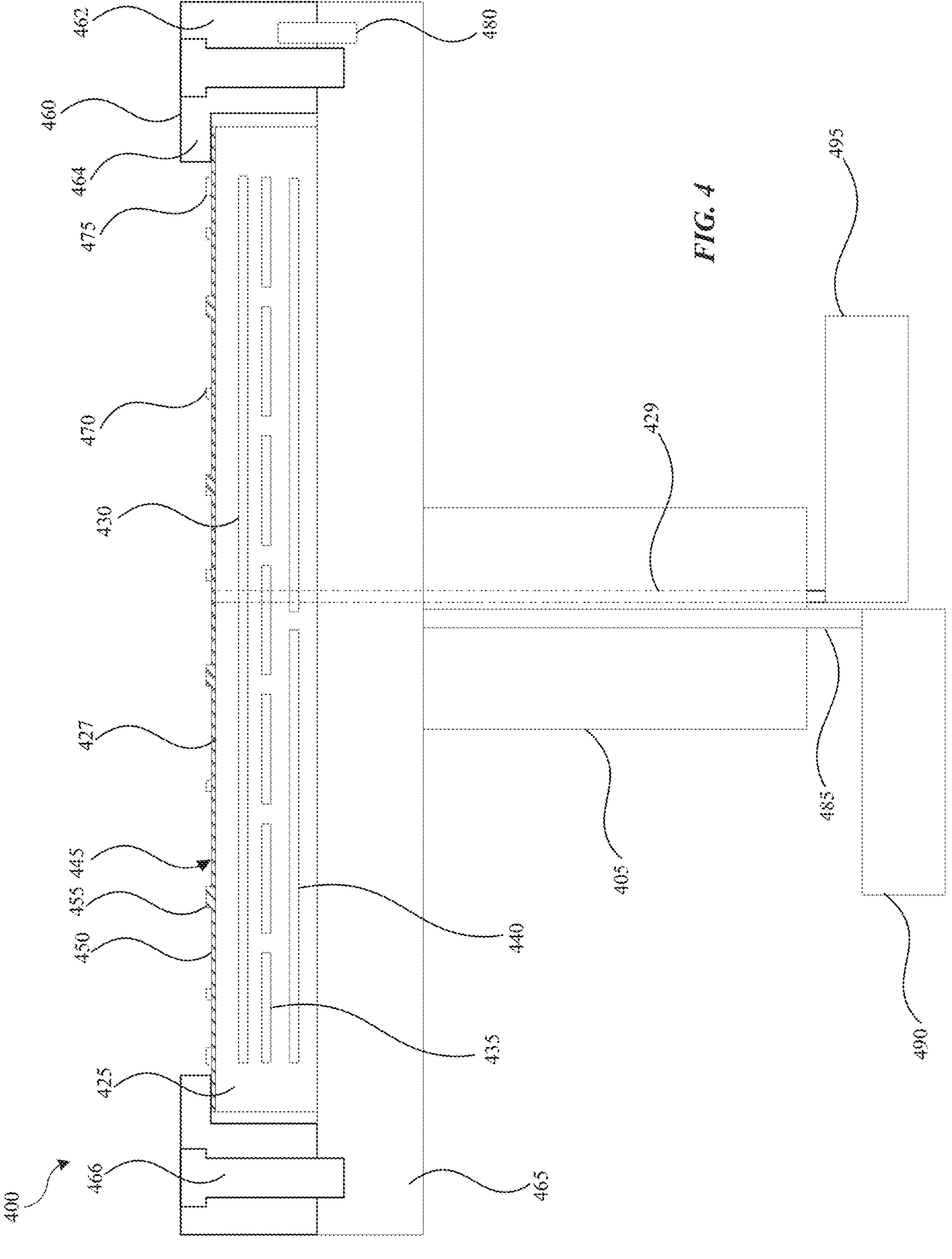
FIG. 4 shows a schematic partial cross-sectional view of an exemplary substrate support assembly according to some embodiments of the present technology.

FIG. 4 shows a schematic partial cross-sectional view of a substrate support assembly 400 according to some embodiments of the present technology. As explained above, the present technology may be used in some embodiments to perform film depositions and cures within a single chamber. Substrate support assembly 400 may be similar to substrate support assembly 310, and may include any feature, component, or characteristic of the support described above, including any associated components or power supplies.

Substrate support assembly 400 may include a support stem 405. An electrostatic chuck body 425, which may include one or more components embedded or disposed within the body, may be positioned atop the support stem 405. The components incorporated within the top puck may not be exposed to processing materials in some embodiments, and may be fully retained within the chuck body 425. In the illustrated embodiment, the electrostatic chuck body 425 may be formed from a dielectric material such as, but not limited to, aluminum oxide and/or aluminum nitride.

Electrostatic chuck body 425 may define a substrate support surface or substrate seat 427, and may be characterized by a thickness and length or diameter depending on the specific geometry of the chuck body. In some embodiments the chuck body 425 may be elliptical, and may be characterized by one or more radial dimensions from a central axis through the chuck body. It is to be understood that the top puck may be any geometry, and when radial dimensions are discussed, they may define any length from a central position of the chuck body 425. In some embodiments, the surface of the substrate seat 427 may be substantially flat (e.g., at least 95% planar, at least 97%, planar, at least 99% planar, or more) and the electrostatic chuck body 425 may operate as a coulombic chuck, although other designs are possible. The electrostatic chuck body 425 may define a backside gas lumen 429 that may extend through the surface of the substrate seat 427 to supply a gas to the backside of a wafer. For example, the backside gas lumen 429 may extend from the surface of the substrate seat 427 and through a thickness of the electrostatic chuck body 425 and/or stem 405, where the backside gas lumen 429 may couple with a gas source 495. The gas source 495 may supply an inert gas, such as helium, to the back side of a substrate via the backside gas lumen 429. The gas may fill gaps between the substrate with the substrate seat 427 and may facilitate heat exchange between the electrostatic chuck body 425 and the substrate to more efficiently heat the substrate to a desired temperature for a given processing operation.

Figure 4A:
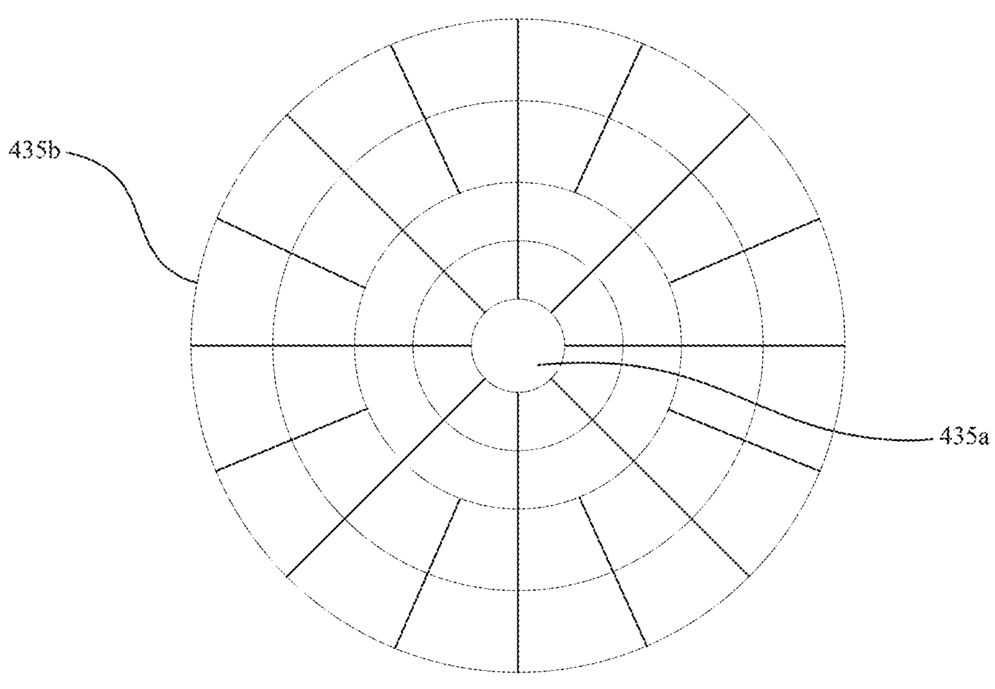
FIG. 4A shows a top plan view of a heater arrangement for an exemplary substrate support assembly according to some embodiments of the present technology.

As noted above, one or more components may be embedded or disposed within the electrostatic chuck body 425. For example, at least one chucking electrode 430 may be embedded within the electrostatic chuck body 425. The at least one chucking electrode 430 may include one or more monopolar electrodes or a number of bipolar/multipolar electrodes. In some embodiments, at least one heater (such as an AC heating coil) may be disposed within the electrostatic chuck body 425. For example, as illustrated, the electrostatic chuck body 425 may include one or more upper heaters 435 and/or one or more lower heaters 440. The heaters may be positioned above and/or below the chucking electrodes 430 in various embodiments. As illustrated, both the upper heaters 435 and the lower heaters 440 are disposed below the chucking electrodes 430. In a particular embodiment, the upper heaters 435 may include a number of pixel heaters that provide temperature control at a large number of small, discrete locations of the substrate seat 427. For example, a number of upper heaters 435 may be arranged at different angular and/or radial positions, such as in a dartboard configuration. More specifically, a central-most upper heater 435*a* may be circular and/or annular in shape, with a number and annular bands of arc-shaped upper heaters 435*b* being disposed radially outward of the central-most upper heater 435*a* as best illustrated in FIG. 4A. Such a configuration may provide a high level of granularity to carefully tune the temperature at individual regions of the substrate seat 427 and may be used to combat various forms of temperature non-uniformity (e.g., planar, radial, residual, etc.). Any number of upper heaters 435 may be provided in various embodiments. For example, the electrostatic chuck body 425 may include at least or about one upper heater, at least or about 5 upper heaters, at least or about 10 upper heaters, at least or about 20 upper heaters, at least or about 40 upper heaters, at least or about 50 upper heaters, at least or about 75 upper heaters, at least or about 100 upper heaters, at least or about 125 upper heaters, at least or about 150 upper heaters, or more. It will be appreciated that the size, number, and layout of upper heaters 435 illustrated is merely provided as one example, and numerous variations exist within the scope of the present invention.

Figure 4B:
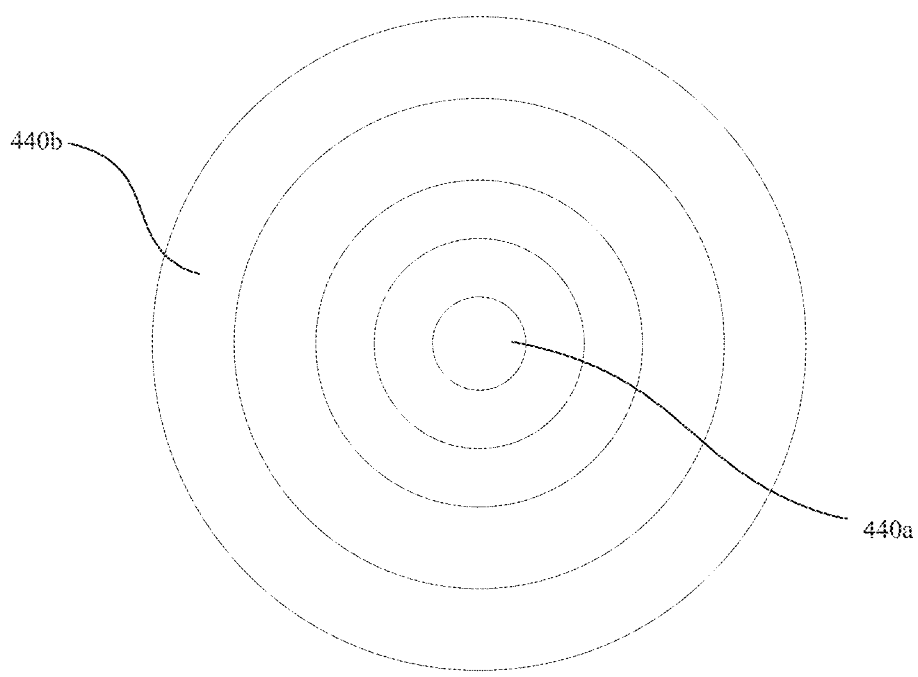
FIG. 4B shows a top plan view of a heater arrangement for an exemplary substrate support assembly according to some embodiments of the present technology.
Figure 4C:
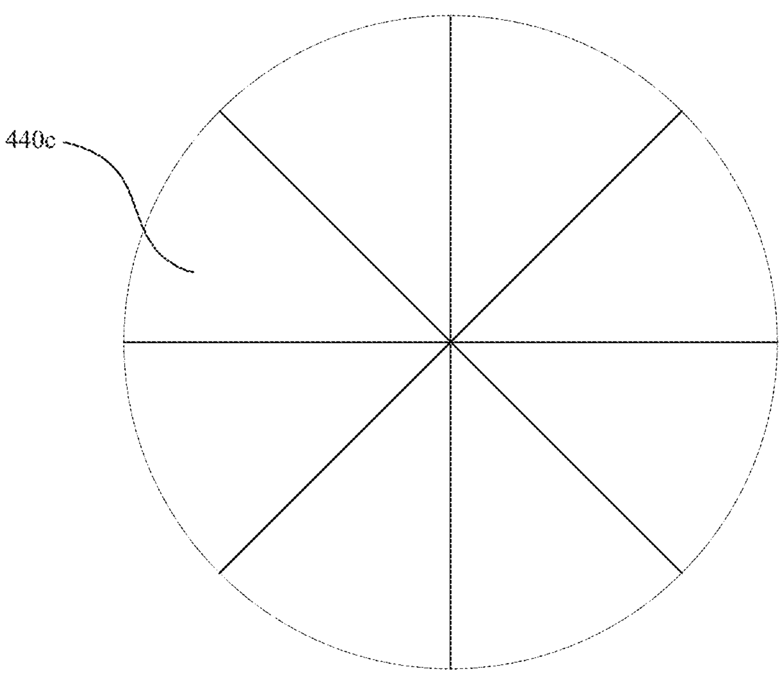
FIG. 4C shows a top plan view of a heater arrangement for an exemplary substrate support assembly according to some embodiments of the present technology.

The lower heaters 440 may include a number of zonal heaters that may provide temperature control to one or more larger zones of the substrate seat 427 to address temperature uniformity issues. In some embodiments, the lower heaters 440 may include a central-most lower heater 440*a* that is circular and/or annular in shape, with one or more annular lower heaters 440*b* that are concentric with the central-most lower heater 440*a* as shown in FIG. 4B. In some embodiments, the lower heaters 440*c* may be generally wedge shaped as shown in FIG. 4C. Any number of lower heaters 440 may be included to provide temperature control zones to address various non-uniformity issues. For example, the electrostatic chuck body 425 may include at least or about one lower heater, at least or about two lower heaters, at least or about three lower heaters, at least or about four lower heaters, at least or about five lower heaters, at least or about ten lower heaters, or more. It will be appreciated that the size, number, and layout of lower heaters 440 illustrated is merely provided as one example, and numerous variations exist within the scope of the present invention.

Each heater 435, 440 may be coupled with a power source, such as via one or more rods, leads, and/or other electrical connections that may extend through the electrostatic chuck body 425 and/or stem 405. While described with upper heaters 435 being pixel heaters and lower heaters 440 being zonal heaters, it will be appreciated that such positioning may be reversed in various embodiments. Additionally, in some embodiments, both sets of heaters may be zonal heaters or pixel heaters. Some embodiments may include fewer (e.g., zero or one) sets of heaters, while other embodiments may include additional layers of heaters.

Figure 4D:
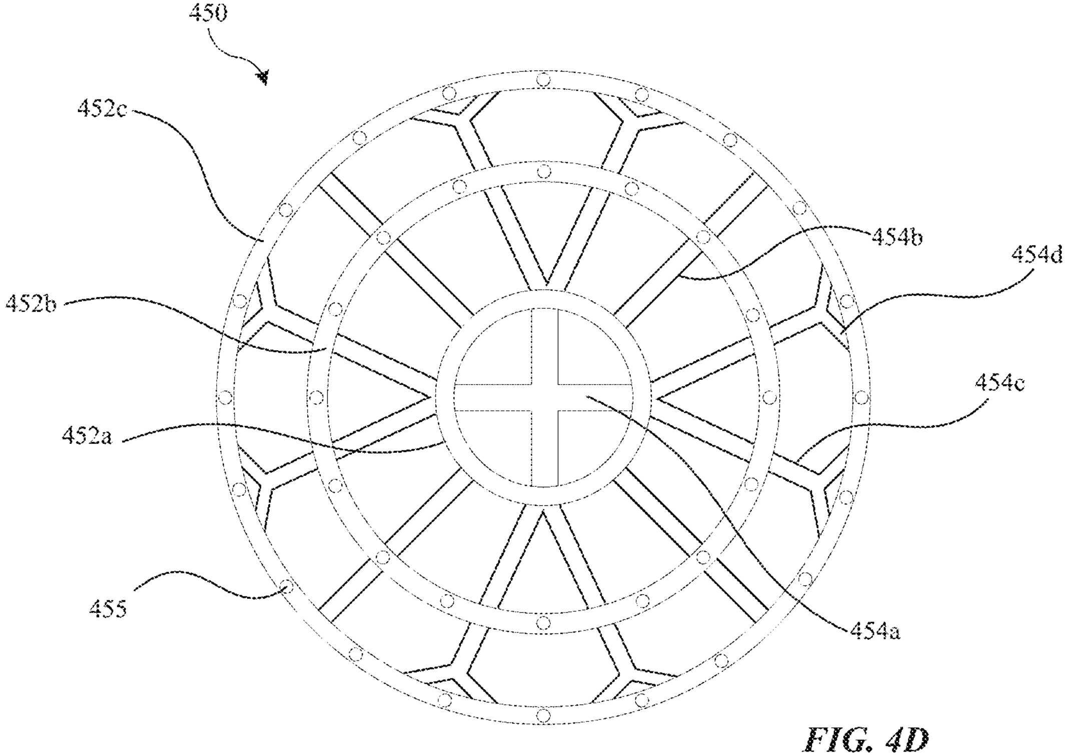
FIG. 4D shows a top plan view of a conductive mesh arrangement for an exemplary substrate support assembly according to some embodiments of the present technology.

A bias electrode 445 may be coupled with the electrostatic chuck body 425. For example, the bias electrode 445 may include a conductive mesh 450 that is disposed atop the substrate seat 427. In some embodiments, the conductive mesh 450 may be applied to the substrate seat 427 by atomic layer deposition, sputtering, brazing, and/or other techniques. FIG. 4D illustrates a top plan view of conductive mesh 450 according to some embodiments of the present invention. For example, the conductive mesh 450 may include one or more concentric rings 452 that are coupled together via one or more spokes 454. As illustrated, the conductive mesh 450 may include an inner ring 452*a*, an outer ring 452*c*, and an intermediate ring 452*b* that is disposed between the inner ring 452*a* and the outer ring 452*c*. While shown with three rings 452, it will be appreciated that more or fewer rings 452 may be included in various embodiments. For example, the conductive mesh 450 may include at least one ring, at least two rings, at least three rings, at least four rings, at least five rings, at least six rings, or more. The rings 452 may be spaced at regular and/or irregular radial intervals. As illustrated, the inner ring 452*a* is positioned 50 mm from a center of the conductive mesh 450, intermediate ring 452*b* is positioned 150 mm from the center, and outer ring 452*c* is positioned 250 mm from the center, although other spacings are possible in various embodiments.

Each of the rings 452 may be interconnected with one or more (and possibly all) other rings 452 via one or more spokes 454 that extend between and couple the various rings 452. In some embodiments, some or all of the spokes 454 may extend along a radial line from the center of the conductive mesh 450 and may couple with each of the rings 452. As illustrated, the conductive mesh 450 includes inner spokes 454*a* that extend from the center to the inner ring 452*a*. The inner spokes 454*a* may be at regular and/or irregular angular intervals about the conductive mesh 450. While four inner spokes 454*a* are shown, it will be appreciated that more or fewer inner spokes 454*a* may be included in various embodiments. A number of radial spokes 454*b* may extend from the inner ring 452*a* to the outer ring 452*c* (and may contact intermediate ring 452*b* in some embodiments). The radial spokes 454*b* are illustrated as being angularly offset from the inner spokes 454*a*, however in some embodiments the radial spokes 454*b* may be aligned with the inner spokes 454*a*. The radial spokes 454*b* may be at regular and/or irregular angular intervals about the conductive mesh 450. While four radial spokes 454*b* are shown, it will be appreciated that more or fewer radial spokes 454*b* may be included in various embodiments, and a number of inner spokes 454*a* and radial spokes 454*b* may be the same or different. A number of v-shaped spokes 454*c* may extend from the inner ring 452*a* toward the outer ring 452*c*. For example, at each junction between an inner spoke 454*a* and the inner ring 452*a*, a v-shaped spoke 454*c* may branch outward, with a point of the v being at the junction. Outer ends (e.g., beyond the intermediate ring 452*b*) of each v-shaped spoke 454*c* may branch into additional v-shaped portions 454*d* proximate the outer ring 452*c*. Each v-shaped portion 454*d* may then contact the outer ring 452*c*. The v-shaped spokes 454*c* may be at regular and/or irregular angular intervals about the conductive mesh 450. While four v-shaped spokes 454*c* are shown, it will be appreciated that more or fewer v-shaped spokes 454*c* may be included in various embodiments. Additionally, while illustrated as being v-shaped, it will be appreciated that other shapes of spokes (such as radial/linear spokes) may be used in various embodiments.

While described as having a number of interconnected rings and spokes, the conductive mesh 450 may take other forms in various embodiments. For example, the conductive mesh 450 may include a grid formed of a number of rectangular shapes and/or other shapes. The grid may be formed of shapes of uniform and/or varying sizes and may distribute nodes (e.g., junctions where multiple segments intersect) uniformly and/or irregularly about the substrate seat 427.

The bias electrode 445 may include a number of conductive mesas 455 that protrude upward from the conductive mesh 450. The conductive mesas 455 and/or conductive mesh 450 may be formed from a conductive material, such as aluminum, chromium, gold, and/or other conductive material. The mesas 455 may support a bottom surface of the substrate during processing operations. The mesas 455 may be provided on the rings and/or spokes of the conductive mesh 450 in some embodiments. For example, as illustrated, the mesas 455 are arranged about each ring, and may be at regular and/or irregular intervals about each ring (or spoke). In some embodiments, each mesa 455 may have a height (relative to the surface of the substrate seat 427) of less than about 10 mils, less than about 9 mils, less than about 8 mils, less than about 7 mils, less than about 6 mils, less than about 5 mils, less than about 4 mils, less than about 3 mils, less than about 2 mils, less than about 1 mil, less than about 0.5 mils, or less. The mesas 455 may each have a same diameters (or cross-sectional areas) or some may have different diameters (or cross-sectional areas) in various embodiments.

In some embodiments, rather than being substantially flat, the surface of the substrate seat 427 may define a number of additional mesas 470. The additional mesas 470 may be interposed between the conductive mesas 455, and may each have a substantially same height as the mesas 455. The additional mesas 470 may have same or different lateral dimensions than mesas 455. For example, in some embodiments each additional mesa 470 may have a diameter that is smaller than a diameter of the mesas 455. For example, the diameter of each additional mesa 470 may be between about 0.5 mm and 1.5 mm, between about 0.75 mm and 1.25 mm, or about 1 mm. The diameter of each mesa 455 may be between about 1.5 mm and 2.5 mm, between about 1.75 mm and 2.25 mm, or about 2 mm. The substrate support assembly 400 may include more of the additional mesas 470 than the mesas 455. For example, in a particular embodiment there may be between about 150 and 600 additional mesas, between about 200 and 550 additional mesas, between about 250 and 500 additional mesas, between about 300 and 450 additional mesas, or between about 350 and 400 additional mesas. There may be between about 25 and 150 conductive mesas, between about 50 and 125 conductive mesas, or between about 75 and 100 conductive mesas. The number of additional mesas 470 may outnumber the conductive mesas 455 by at least 1.5×, at least 2×, at least 3×, at least 4×, at least 5×, at least 6×, at least 7×, or more.

The additional mesas 470 may not be coupled with the conductive mesh 450, but instead may be positioned between the various rings 452 and spokes 454. In some embodiments, the additional mesas 470 may be formed from a dielectric material, such as the material used to form the electrostatic chuck body 425. In other embodiments, the additional mesas 470, while unpowered and not a part of the bias electrode 445, may be formed from a conductive material. For example, the additional mesas may be formed from the same material as the conductive mesh 450 and/or the conductive mesas 455. This may enable the conductive mesas 45 and additional mesas 470 to be deposited and/or otherwise applied to the surface of the substrate seat 427 in a single step and may make it easier to fabricate the various mesas to have a substantially same height.

Exposed surfaces (e.g., those not contacting the electrostatic chuck body 425) of the conductive mesh 450, mesas 455, and/or mesas 470 (when mesas 470 are formed from a conductive material) may be coated with a wear-resistant coating, with the coating applied to at least the mesas 455 and/or mesas 470 being electrically conductive. For example, the coating applied to one or more of the components may include a diamond-like carbon (DLC) coating, a carbide material, a nitride material, and/or other coating. The coating may be hard and may have a low coefficient of friction. An open area (e.g., flat surface of the surface of the substrate seat 427 that is free of mesas 455 and/or mesas 470) may be at least 75% of the surface area of the surface of the substrate seat 427 at least 80% of the surface area, at least 85% of the surface area, at least 90% of the surface area, at least 95% of the surface area, or more.

The bias electrode 445 may be coupled with one or more power sources 490 via one or more electrical lines 485 (such as leads, rods, wires, etc.) that may extend through the electrostatic chuck body 425 and/or stem 405. The power source 490 may supply a bias voltage to the bias electrode 445. For example, a DC power source may supply a DC voltage to the bias electrode 445. The bias voltage may be transferred to a substrate seated atop the conductive mesas 455, which may create an electric field across the substrate that may enable electric field exposure post exposure bake operations to be performed.

In some embodiments, the electrical line 485 may extend entirely to the bias electrode 445 and may be directly coupled with the bias electrode 445. In other embodiments, the electrical line 485 may be indirectly coupled with the bias electrode 445 via one or more intervening components. For example, as illustrated the substrate support assembly 400 may include an edge ring 460. The edge ring 460 may be formed from a conductive material, such as aluminum. The edge ring 460 may include an annular body 462 and a flange 464 that protrudes inward from an inner diameter of the annular body 462. As illustrated, the flange 464 extends from a top surface of the annular body 462 such that top surfaces of the flange 464 and the annular body 462 are substantially (e.g., within 95%, within 97%, within 99%, or more) planar, although other configurations are possible in various embodiments. A bottom surface of the flange 464 may extend over and/or be seated atop a peripheral edge of the electrostatic chuck body 425. A peripheral edge of the conductive mesh 450 (which may extend radially outward beyond a bevel of a substrate to be supported) may be positioned between the electrostatic chuck body 425 and the bottom surface of the flange 464 and may contact the flange 464. In some embodiments, at least a portion of the conductive mesh 450 that is in contact with the flange 464 may include a conductive material such as, but not limited to, metal traces (e.g., gold, silver, nickel, DLC, carbide, nitride, etc.) that have been plated, deposited, and/or otherwise coupled with the conductive mesh 450. The conductive materials may create an electrical connection between the conductive mesh 450 and the edge ring 460 that may facilitate electrical transfer of a bias voltage from the edge ring 460 to the bias electrode 445. Flexible, conductive gaskets may be added between 450 and 464 to improve electrical connection and to prevent high forces on the electrostatic chuck body 425.

In some embodiments, the substrate support assembly 400 may include a conductive cooling plate 465, which may be coupled with the electrostatic chuck body 425. For example, the cooling plate 465 may be coupled with a bottom surface of the electrostatic chuck body 425. In some embodiments, a diameter of the cooling plate 465 may be greater than a diameter of the electrostatic chuck body 425 such that the peripheral edge of the cooling plate 465 extends laterally beyond the peripheral edge of the electrostatic chuck body 425. In such instances, a bottom surface of the annular body 462 of the edge ring 460 may be positioned above and/or seated atop (directly or indirectly) the top surface of the cooling plate 465. In some embodiments, the edge ring 460 and the cooling plate 465 may be fastened, clamped, and/or otherwise coupled together. For example, one or more fasteners (such as bolts 466), clamps, or other coupling mechanisms may be used to secure the two components together. In some embodiments, an electrical connection 480, such as a conductive pin and/or other electrically conductive element may be used to electrically couple and/or improve an electrical coupling between the edge ring 460 and the cooling plate 465. For example, each of the annular body 462 and the cooling plate 465 may define one or more recesses that each receive a respective electrical connection 480. The electrical coupling of the edge ring 460 and the cooling plate 465 may enable a bias voltage to be transferred from the cooling plate 465 to the edge ring 460, and subsequently to the bias electrode 445. For example, the cooling plate 465 may be directly or indirectly coupled with the electrical line 485 to couple the cooling plate 465 with the power source 490.

In some embodiments, the electrostatic chuck body 425 may define and/or otherwise include a sealing band 475 that may be positioned radially outward of the various mesas. The sealing band 475 may be at substantially the same height as the mesas, and in some embodiments may be sized and positioned to support a peripheral edge of the substrate. The sealing band 475 may be generally annular in shape, and in some embodiments may be continuous or substantially continuous (e.g., may extend about greater than 90%, greater than 95%, greater than 97%, greater than 99%, or more) of a circumference about the mesas. This may enable the sealing band 475 to prevent any of the inert gas from leaking from the backside of the substrate into the processing region. The sealing band 475 may be made of conductive material and may be formed during the same process as that of the bias electrode 445. The electrical connection 480 to the edge ring 460 may be formed on the sealing band 475 in some embodiments.

Figures 5, 6:
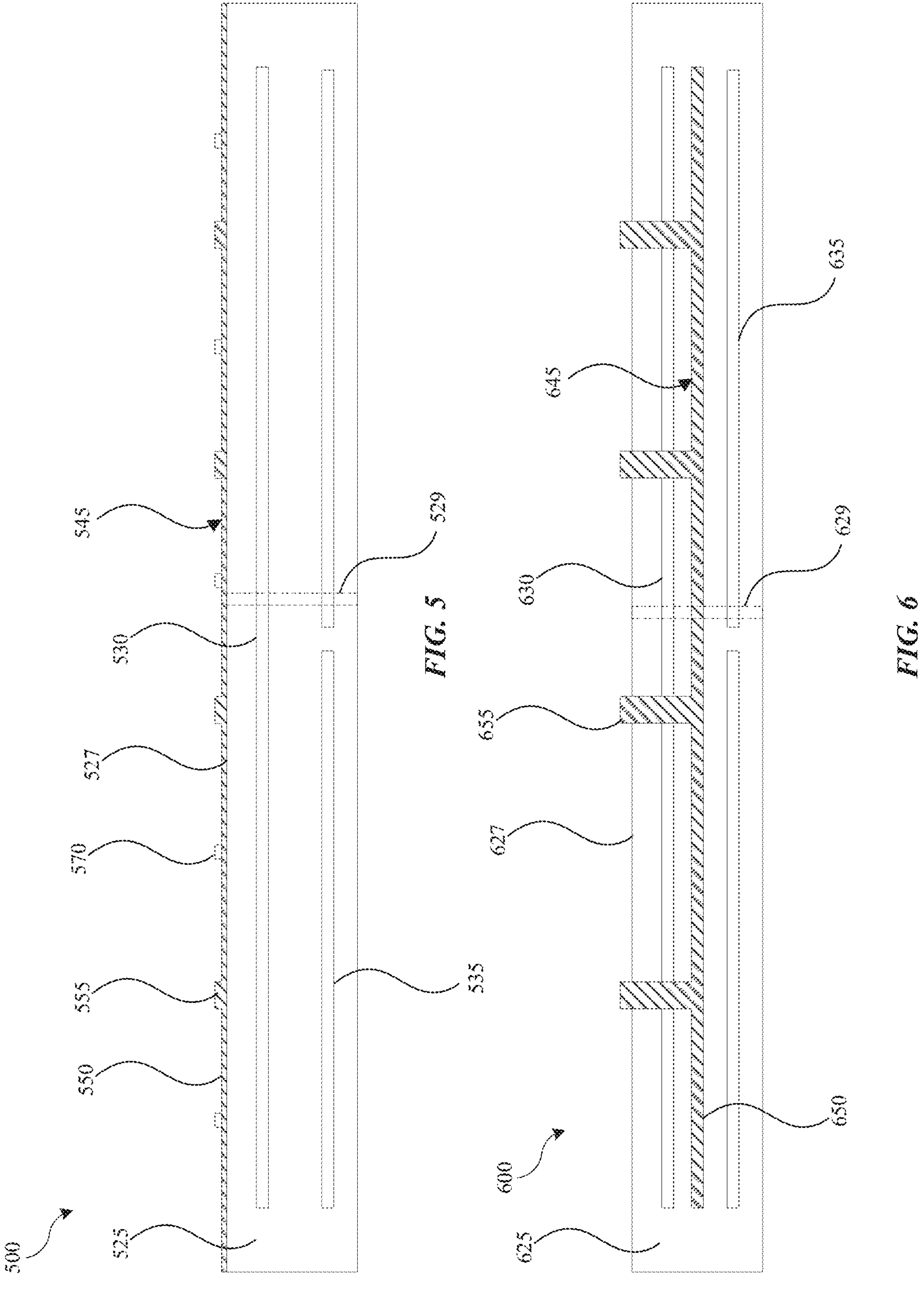
FIG. 5 shows a schematic partial cross-sectional view of an exemplary substrate support assembly according to some embodiments of the present technology.
FIG. 6 shows a schematic partial cross-sectional view of an exemplary substrate support assembly according to some embodiments of the present technology.

FIG. 5 shows a schematic partial cross-sectional view of an exemplary substrate support assembly 500 according to some embodiments of the present technology. Substrate support assembly 500 may be similar to substrate support assembly 310 and/or 400, and may include any feature, component, or characteristic of the support described above, including any associated components or power supplies. Substrate support assembly 500 may include a support stem (not shown) and an electrostatic chuck body 525. The electrostatic chuck body 525 may be formed from a dielectric material, such as aluminum oxide and/or aluminum nitride. Electrostatic chuck body 525 may define a substrate support surface or substrate seat 527. The electrostatic chuck body 525 may define a backside gas lumen 529 that may extend through the surface of the substrate seat 527 to supply a gas to the backside of a wafer. The support stem and/or electrostatic chuck body 525 may include one or more components embedded or disposed within the body. For example, the electrostatic chuck body 525 may include one or more heaters 535 having one or more heating elements, such as AC heating coils. Each heating element may be coupled with a power source, such as an AC power source that delivers AC current to the heater 535, to heat the top puck. The current may be delivered to the heater 535 through one or more rods or wires that are disposed within a channel formed within the stem and the electrostatic chuck body 525. The substrate support assembly 500 may include one or more chucking electrodes 530 embedded within. The substrate support assembly 500 may include a bias electrode 545 disposed atop the substrate seat 527. The bias electrode 540 may be similar to bias electrode 445 and may include a conductive mesh 550 and a plurality of conductive mesas 555 that protrude upward from a top surface of the conductive mesh 550. In a particular embodiment, the chucking electrode 530 may include a monopolar electrode and the bias electrode 545 may form an opposite pole as the monopolar chucking electrode 530.

In contrast to substrate support assembly 400, the substrate seat 527 of the substrate support assembly 500 may not be substantially flat/planar. For example, the surface of the substrate seat 527 may define a plurality of additional mesas 570. The additional mesas 570 may be formed of a dielectric material (such as the material used to form the electrostatic chuck body 525), and may be formed integrally with the electrostatic chuck body 525 in some embodiments. The mesas 570 may have a similar structure as mesas 555, and may be interposed between adjacent ones of the mesas 555. Any number of mesas 570 may be included. For example, the electrostatic chuck body 525 may define or otherwise include at least or about 100 mesas 570, at least or about 150 mesas 570, at least or about 200 mesas 570, at least or about 250 mesas 570, at least or about 300 mesas 570, at least or about 350 mesas 570, at least or about 400 mesas 570, at least or about 450 mesas 570, at least or about 500 mesas 570, or more. The mesas 570 may be arranged at regular and/or irregular intervals about the substrate seat 527. Each mesa 570 may have a same or substantially same height as each mesa 555, such that when a substrate is chucked, the substrate contacts all or substantially all (e.g., 95%, 97%, 99%, or more) of the different mesas. The presence of mesas 570 may enable the electrostatic chuck body 525 to operate as a Johnsen-Rahbek chuck, although other designs are possible.

FIG. 6 shows a schematic partial cross-sectional view of an exemplary substrate support assembly 600 according to some embodiments of the present technology. Substrate support assembly 600 may be similar to substrate support assembly 310, 400, and/or 500, and may include any feature, component, or characteristic of the support described above, including any associated components or power supplies. Substrate support assembly 600 may include a support stem (not shown) and an electrostatic chuck body 625. The electrostatic chuck body 625 may be formed from a dielectric material, such as aluminum oxide and/or aluminum nitride. Electrostatic chuck body 625 may define a substrate support surface or substrate seat 627. In some embodiments, the surface of the substrate seat 627 may be substantially flat (e.g., at least 95% planar, at least 97%, planar, at least 99% planar, or more) and the electrostatic chuck body 625 may operate as a coulombic chuck, although other designs are possible. The electrostatic chuck body 625 may define a backside gas lumen 629 that may extend through the surface of the substrate seat 627 to supply a gas to the backside of a wafer. The support stem and/or electrostatic chuck body 625 may include one or more components embedded or disposed within the body. For example, the electrostatic chuck body 625 may include one or more heaters 635 having one or more heating elements, such as AC heating coils. Each heating element may be coupled with a power source, such as an AC power source that delivers AC current to the heater 635, to heat the top puck. The current may be delivered to the heater 635 through one or more rods or wires that are disposed within a channel formed within the stem and the electrostatic chuck body 625. The substrate support assembly 600 may include one or more chucking electrodes 630 embedded within.

The substrate support assembly 600 may include a bias electrode 645 coupled with the electrostatic chuck body 625. The bias electrode 645 may include a conductive mesh 650, which may be embedded within the electrostatic chuck body 625. For example, the conductive mesh 650 may be disposed between the chucking electrode 630 and the heater 635 in some embodiments, although other configurations are possible. The conductive mesh 650 may define and/or otherwise include a plurality of conductive mesas 655 that protrude upward from a top surface of the conductive mesh 650. The conductive mesas 655 may extend upward through the electrostatic chuck body 625 and protrude through and above the surface of the substrate seat 627. A top surface of each conductive mesa 655 may be less than about 10 mils above the surface of the substrate seat 627, less than about 9 mils, less than about 8 mils, less than about 7 mils, less than about 6 mils, less than about 5 mils, less than about 4 mils, less than about 3 mils, less than about 2 mils, less than about 1 mil, less than about 0.5 mils, or less. The mesas may together provide a minimum contact support surface for a substrate positioned atop the substrate seat 627, leaving a gap between a bottom surface of the substrate and the surface of the substrate seat 627 in which an insert gas may be flowed via the backside gas lumen 629.

The conductive mesh 650 may have a similar structure as conductive mesh 450 in some embodiments, despite being embedded within the electrostatic chuck body 625. Similarly, a layout and/or maximum vertical height of the mesas 655 relative to the substrate seat 627 may be similar as described above in relation to bias electrode 445. While shown with the bias electrode 645 being disposed beneath the chucking electrode 630, it will be appreciated that the bias electrode 645 may be positioned above the chucking electrode 630 in some embodiments. In a particular embodiment, the chucking electrode 630 may include a monopolar electrode and the bias electrode 645 may form an opposite pole as the monopolar chucking electrode 630.

Figures 7, 8:
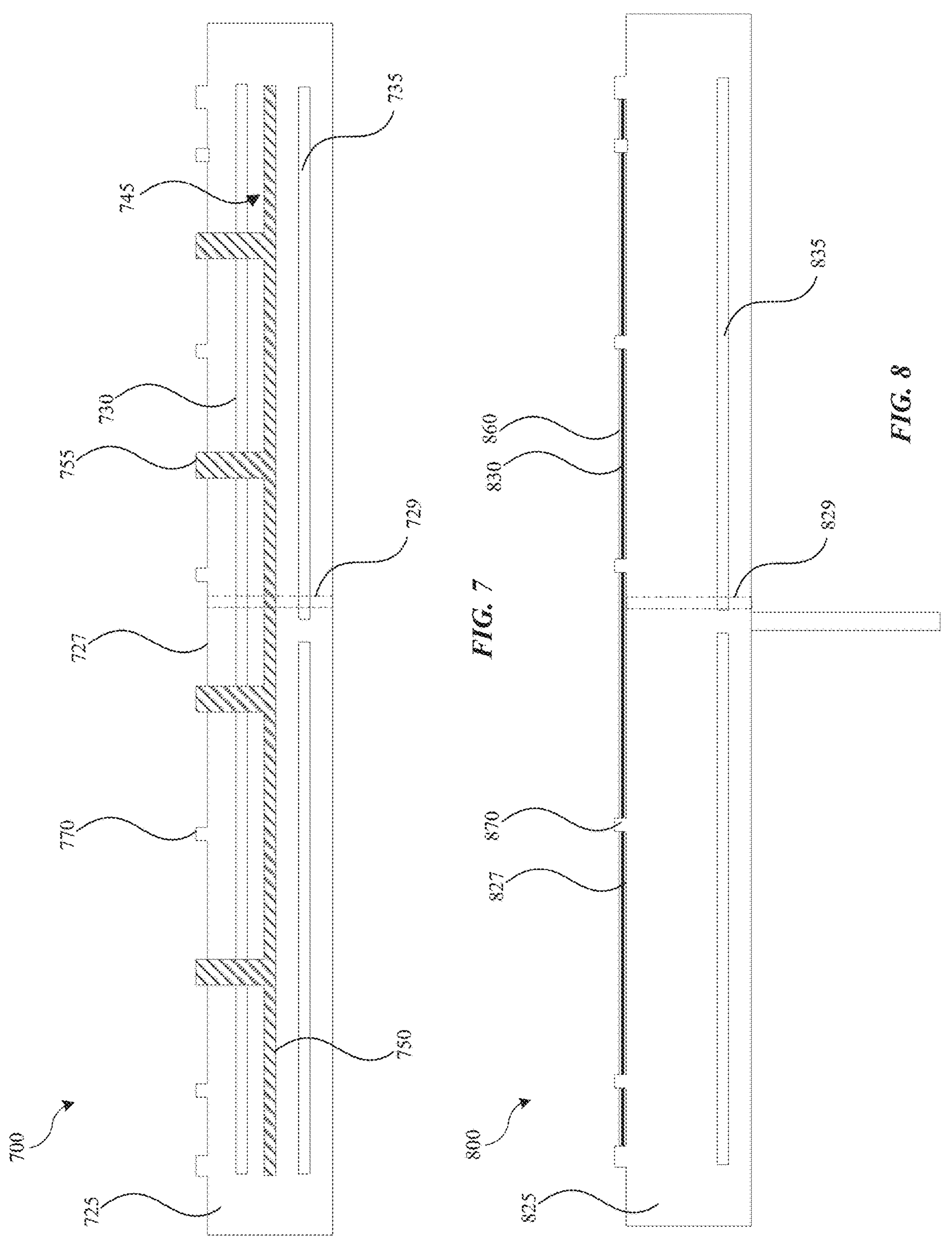
FIG. 7 shows a schematic partial cross-sectional view of an exemplary substrate support assembly according to some embodiments of the present technology.
FIG. 8 shows a schematic partial cross-sectional view of an exemplary substrate support assembly according to some embodiments of the present technology.

FIG. 7 shows a schematic partial cross-sectional view of an exemplary substrate support assembly 700 according to some embodiments of the present technology. Substrate support assembly 700 may be similar to substrate support assembly 310, 400, 500 and/or 600, and may include any feature, component, or characteristic of the support described above, including any associated components or power supplies. Substrate support assembly 700 may include a support stem (not shown) and an electrostatic chuck body 725. The electrostatic chuck body 725 may be formed from a dielectric material, such as aluminum oxide and/or aluminum nitride. Electrostatic chuck body 725 may define a substrate support surface or substrate seat 727. The electrostatic chuck body 725 may define a backside gas lumen 729 that may extend through the surface of the substrate seat 727 to supply a gas to the backside of a wafer. The support stem and/or electrostatic chuck body 725 may include one or more components embedded or disposed within the body. For example, the electrostatic chuck body 725 may include one or more heaters 735 having one or more heating elements, such as AC heating coils. Each heating element may be coupled with a power source, such as an AC power source that delivers AC current to the heater 735, to heat the top puck. The current may be delivered to the heater 735 through one or more rods or wires that are disposed within a channel formed within the stem and the electrostatic chuck body 725. The substrate support assembly 700 may include one or more chucking electrodes 730 embedded within.

The substrate support assembly 700 may include a bias electrode 745 coupled with the electrostatic chuck body 725. The bias electrode 745 may include a conductive mesh 750, which may be embedded within the electrostatic chuck body 725. For example, the conductive mesh 750 may be disposed between the chucking electrode 730 and the heater 735 in some embodiments, although other configurations are possible. The conductive mesh 750 may define and/or otherwise include a plurality of conductive mesas 755 that protrude upward from a top surface of the conductive mesh 750. The conductive mesas 755 may extend upward through the electrostatic chuck body 725 and protrude through and above the surface of the substrate seat 727. A top surface of each conductive mesa 755 may be less than about 10 mils above the surface of the substrate seat 627, less than about 9 mils, less than about 8 mils, less than about 7 mils, less than about 6 mils, less than about 5 mils, less than about 4 mils, less than about 3 mils, less than about 2 mils, less than about 1 mil, less than about 0.5 mils, or less. The mesas may together provide a minimum contact support surface for a substrate positioned atop the substrate seat 727, leaving a gap between a bottom surface of the substrate and the surface of the substrate seat 727 in which an insert gas may be flowed via the backside gas lumen 729.

The conductive mesh 750 may have a similar structure as conductive mesh 450 in some embodiments, despite being embedded within the electrostatic chuck body 725. Similarly, a layout and/or maximum vertical height of the mesas 755 relative to the substrate seat 727 may be similar as described above in relation to bias electrode 445. In a particular embodiment, the chucking electrodes 730 may be bipolar chucking electrodes. In another embodiment, the chucking electrode 730 may include a monopolar electrode and the bias electrode 745 may form an opposite pole as the monopolar chucking electrode 730.

In contrast to substrate support assembly 600, the substrate seat 727 of the substrate support assembly 700 may not be substantially flat/planar. For example, the surface of the substrate seat 727 may define a plurality of additional mesas 770. The additional mesas 770 may be formed of a dielectric material (such as the material used to form the electrostatic chuck body 725), and may be formed integrally with the electrostatic chuck body 725 in some embodiments. The mesas 770 may have a similar structure as mesas 755, and may be interposed between adjacent ones of the mesas 755. Any number of mesas 770 may be included. For example, the electrostatic chuck body 725 may define or otherwise include at least or about 100 mesas 770, at least or about 150 mesas 770, at least or about 200 mesas 770, at least or about 250 mesas 770, at least or about 300 mesas 770, at least or about 350 mesas 770, at least or about 400 mesas 770, at least or about 450 mesas 770, at least or about 500 mesas 770, or more. The mesas 770 may be arranged at regular and/or irregular intervals about the substrate seat 727. Each mesa 770 may have a same or substantially same height as each mesa 755, such that when a substrate is chucked, the substrate contacts all or substantially all (e.g., 95%, 97%, 99%, or more) of the different mesas. The presence of mesas 770 may enable the electrostatic chuck body 725 to operate as a Johnsen-Rahbek chuck, although other designs are possible.

FIG. 8 shows a schematic partial cross-sectional view of an exemplary substrate support assembly 800 according to some embodiments of the present technology. Substrate support assembly 800 may be similar to substrate support assembly 310, 400, 500, 600, and/or 700, and may include any feature, component, or characteristic of the support described above, including any associated components or power supplies. Substrate support assembly 800 may include a support stem (not shown) and an electrostatic chuck body 825. The electrostatic chuck body 825 may be formed from a conductive material, such as aluminum. Electrostatic chuck body 825 may define a substrate support surface or substrate seat 827. The electrostatic chuck body 825 may define a backside gas lumen 829 that may extend through the surface of the substrate seat 827 to supply a gas to the backside of a wafer. The support stem and/or electrostatic chuck body 825 may include one or more components embedded or disposed within the body. For example, the electrostatic chuck body 825 may include one or more heaters 835 having one or more heating elements, such as AC heating coils. Each heating element may be coupled with a power source, such as an AC power source that delivers AC current to the heater 835, to heat the top puck. The current may be delivered to the heater 835 through one or more rods or wires that are disposed within a channel formed within the stem and the electrostatic chuck body 825. The substrate seat 827 of the substrate support assembly 800 may not be substantially flat/planar. For example, the surface of the substrate seat 827 may define a plurality of mesas 870. The mesas 870 may be formed of a conductive material (such as the material used to form the electrostatic chuck body 825), and may be formed integrally with the electrostatic chuck body 825 in some embodiments. The conductive material of the electrostatic chuck body 825 and mesas 870 may enable the electrostatic chuck body 825 to serve as a bias electrode, similar to as described above. For example, the electrostatic chuck body 825 may be coupled with a power source, such as a DC power source, that may DC bias the electrostatic chuck body 825. DC voltage applied to the electrostatic chuck body 825 may electrically bias a substrate supported atop the mesas 870 to create an electric field across substrate. The mesas 870 may have a similar structure as those described herein. Any number of mesas 870 may be included. For example, the electrostatic chuck body 825 may define or otherwise include at least or about 100 mesas 870, at least or about 150 mesas 870, at least or about 200 mesas 870, at least or about 250 mesas 870, at least or about 300 mesas 870, at least or about 350 mesas 870, at least or about 400 mesas 870, at least or about 450 mesas 870, at least or about 500 mesas 870, or more. The mesas 870 may be arranged at regular and/or irregular intervals about the substrate seat 827. Each mesa 870 may have a same or substantially same height as each mesa 855, such that when a substrate is chucked, the substrate contacts all or substantially all (e.g., 95%, 97%, 99%, or more) of the different mesas. The conductive substrate support assembly 800 may operate as a coulombic chuck, although other designs are possible.

The substrate support assembly 800 may include a polymeric material 860 that is bonded atop the substrate seat 827 between each of the mesas 870. The polymeric material 860 may be formed from a dielectric polymer, such as a polyamide, in some embodiments. One or more chucking electrodes 830 may be embedded within the polymeric material 860, which may be monopolar, bipolar, and/or multipolar in various embodiments. The chucking electrodes 830 may be coupled with one or more power sources that may supply a chucking current to enable the substrate support assembly 800 to operate as an electrostatic chuck, such as a coulombic chuck. In a particular embodiment, the chucking electrodes 830 may be bipolar and/or multipolar chucking electrodes. In another embodiment, the chucking electrode 830 may include a monopolar electrode and the bias electrode formed from the electrostatic chuck body 825 may form an opposite pole as the monopolar chucking electrode 830.

Figure 9:
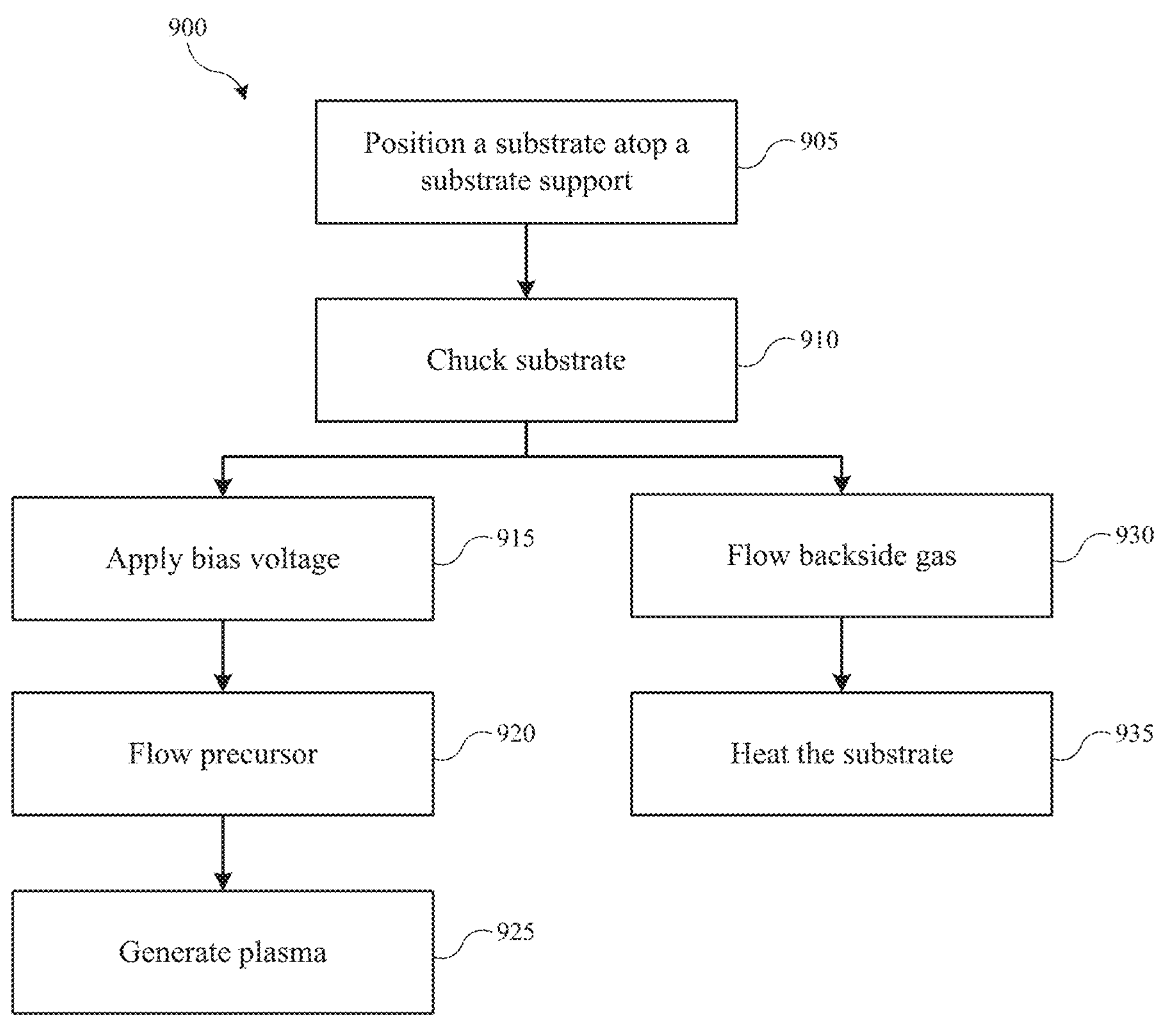
FIG. 9 is a flowchart showing operations of a method of processing a substrate according to some embodiments of the present technology.

FIG. 9 shows operations of an exemplary method 900 of semiconductor processing according to some embodiments of the present technology. The method may be performed in a variety of processing chambers, including processing system 200 or chamber 300 described above, which may include substrate support assemblies according to embodiments of the present technology, such as substrate support assembly 310, 400, 500, 600, 700, and/or 800 described herein. Method 900 may include a number of optional operations, which may or may not be specifically associated with some embodiments of methods according to the present technology.

Method 900 may include a processing method that may include operations for forming a hardmask film or other deposition operations, performing electric field exposure post exposure bake, and/or other processing operations. The method may include optional operations prior to initiation of method 900, or the method may include additional operations. For example, method 900 may include operations performed in different orders than illustrated. A substrate, such as a semiconductor substrate, may be positioned atop a substrate support assembly at operation 905. For example, the substrate may be seated atop a number of conductive mesas (and possibly a number of dielectric mesas) that are disposed about a substrate seat of an electrostatic chuck body. At operation 910, the substrate may be clamped to a support surface of a substrate platform using a chucking voltage applied to one or more chucking electrodes. At operation 915, a bias voltage, such as a DC bias voltage, may be applied to the substrate using a bias electrode that is formed from and/or coupled with the electrostatic chuck body. The bias voltage may create an electric field across the substrate, which may enable electric field exposure post exposure bake operations and/or other deposition operations to be performed. One or more precursors may be flowed into a processing chamber at operation 920. For example, the precursor may be flowed into a chamber, such as included in chamber 300. At operation 925, a plasma may be generated of the precursors within the processing region.

Process 900 may optionally include flowing an inert gas, such as helium, to a backside of the substrate once the substrate has been clamped to the electrostatic chuck body at operation 930. The inert gas may flow within gaps between the substrate and the electrostatic chuck body and may thermally couple the substrate with the electrostatic chuck body. This may enhance thermal transfer between the objects and may help more quickly and uniformly heat the substrate. This may help improve the uniformity of film on the substrate, and the increased heating rate may help increase throughput of the chamber. In some embodiments, method 900 may include heating a top surface of the electrostatic chuck body at operation 935. For example, an AC current may be supplied to one or more heating elements to heat a top portion of the electrostatic chuck body. Although the substrate and/or support may be heated to any temperature previously described, in some embodiments the substrate support may be heated to a temperature above or about 80° C., while being heated to a temperature of less than or about 500° C., less than or about 400° C., less than or about 300° ° C., or less. The heat may be applied before, during, and/or after chucking the substrate. In the preceding description, for the purposes of explanation, numerous details have been set forth in order to provide an understanding of various embodiments of the present technology. It will be apparent to one skilled in the art, however, that certain embodiments may be practiced without some of these details, or with additional details.

It will be appreciated that the various operations of process 900 may be performed in different orders, with some of the operations being performed in parallel. For example, applying the bias voltage, flowing the precursor, and/or generating the plasma may be formed in parallel with flowing the backside gas and/or heating the substrate. Additionally, applying the bias voltage, flowing the precursor, and/or generating the plasma may be performed sequentially and/or in parallel with one another. Similarly, flowing the backside gas may be performed sequentially and/or in parallel with heating the substrate.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a heater” includes a plurality of such heaters, and reference to “the mesh” includes reference to one or more meshes and equivalents thereof known to those skilled in the art, and so forth.

Also, the words “comprise(s)”, “comprising”, “contain(s) ”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:

an electrostatic chuck body defining a substrate support surface that defines a substrate seat, wherein the electrostatic chuck body defines a backside gas lumen that extends through a surface of the substrate seat;

a bias electrode coupled with the electrostatic chuck body, the bias electrode comprising a plurality of conductive mesas that protrude upward across the substrate seat and comprise top surfaces that are exposed through the electrostatic chuck body;

a support stem coupled with the electrostatic chuck body;

at least one chucking electrode embedded within the electrostatic chuck body, wherein the at least one chucking electrode is distinct from the bias electrode; and at least one heater embedded within the electrostatic chuck body.

2. The substrate support assembly of claim 1, wherein:

the bias electrode comprises a conductive mesh disposed atop the surface of the substrate seat.

3. The substrate support assembly of claim 1, further comprising:

an edge ring coupled with a peripheral edge of the electrostatic chuck body, wherein an edge of the bias electrode comprises a conductive element that contacts the edge ring;

a cooling plate disposed beneath the electrostatic chuck body, the cooling plate being coupled with a bottom surface of the edge ring; and an electrical connection between the edge ring and the cooling plate.

4. The substrate support assembly of claim 1, wherein: the plurality of conductive mesas comprise a wear resistant, electrically conductive coating.

5. The substrate support assembly of claim 1, wherein: the electrostatic chuck body operates as a Johnsen-Rahbek chuck; and the electrostatic chuck body defines a plurality of additional mesas that protrude from the surface of the substrate seat.

6. The substrate support assembly of claim 1, further comprising:

a power source that is electrically coupled with the bias electrode.

7. The substrate support assembly of claim 1, wherein: the at least one heater comprises one or more upper heaters and one or more lower heaters.

8. The substrate support assembly of claim 7, wherein: the one or more upper heaters comprise a plurality of pixel heaters;

the plurality of pixel heaters comprise multiple heaters at different angular positions relative to a center of the substrate seat and multiple heaters at different radial positions relative to the center of the substrate seat; and the one or more lower heaters comprise a plurality of zonal heaters.

9. The substrate support assembly of claim 8, wherein: the plurality of zonal heaters comprise one or more heaters selected from a group consisting of:

a plurality of wedge-shaped heaters;

a plurality of arc-shaped heaters;

a central circular heater; and one or more annular heaters that are concentric with the central circular heater.

10. The substrate support assembly of claim 1, wherein: the bias electrode is embedded within the electrostatic chuck body and the plurality of conductive mesas protrude through the surface of the substrate seat.

11. A substrate support assembly, comprising:

an electrostatic chuck body defining a substrate support surface that defines a substrate seat, wherein the electrostatic chuck body defines a backside gas lumen that extends through a surface of the substrate seat;

a bias electrode comprising a conductive mesh disposed atop the surface of the substrate seat, the bias electrode comprising a plurality of conductive mesas that protrude upward from the conductive mesh;

a support stem coupled with the electrostatic chuck body;

at least one chucking electrode embedded within the electrostatic chuck body; and at least one heater embedded within the electrostatic chuck body.

12. The substrate support assembly of claim 11, further comprising:

an edge ring coupled with a peripheral edge of the electrostatic chuck body, wherein an edge of the bias electrode comprises a conductive element that contacts the edge ring;

a cooling plate disposed beneath the electrostatic chuck body, the cooling plate being coupled with a bottom surface of the edge ring; and an electrical connection between the edge ring and the cooling plate.

13. The substrate support assembly of claim 11, wherein: the electrostatic chuck body operates as a coulombic chuck; and the surface of the substrate seat is substantially flat where none of the plurality of conductive mesas are present.

14. The substrate support assembly of claim 11, wherein: the conductive mesh comprises an inner ring, an outer ring, and a plurality of spokes that connect the inner ring and the outer ring.

15. The substrate support assembly of claim 14, wherein: the conductive mesh further comprises an intermediate ring disposed between the inner ring and the outer ring; and the intermediate ring is coupled with the plurality of spokes.

16. The substrate support assembly of claim 11, wherein: at least 75% of a surface area of the surface of the substrate seat is free of mesas.

17. A substrate support assembly, comprising:

an electrostatic chuck body defining a substrate support surface that defines a substrate seat, wherein the electrostatic chuck body defines a backside gas lumen that extends through a surface of the substrate seat;

a bias electrode coupled with the electrostatic chuck body, the bias electrode comprising a plurality of conductive mesas that protrude upward across the substrate seat;

an edge ring coupled with a peripheral edge of the electrostatic chuck body, wherein an edge of the bias electrode comprises a conductive element that contacts the edge ring;

a cooling plate disposed beneath the electrostatic chuck body, the cooling plate being coupled with a bottom surface of the edge ring; and an electrical connection between the edge ring and the cooling plate;

a support stem coupled with the electrostatic chuck body;

at least one chucking electrode embedded within the electrostatic chuck body; and at least one heater embedded within the electrostatic chuck body.

18. The substrate support assembly of claim 17, further comprising:

an additional plurality of mesas having a first diameter, wherein the plurality of conductive mesas have a second diameter that is larger than the first diameter.

19. The substrate support assembly of claim 18, wherein: the substrate support assembly comprises a greater number of the additional plurality of mesas than the plurality of conductive mesas.

20. The substrate support assembly of claim 18, wherein: the additional plurality of mesas comprise a same material as the plurality of conductive mesas.

* * * * *